Figure 4:
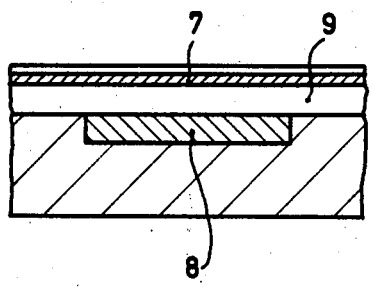

United States Patent [19]

Kooi et al.

[11] 4,101,344

[45] Jul. 18, 1978

[54] METHOD OF MANUFACTURING A SEMICONDUCTOR DEVICE

[75] Inventors: Else Kooi; Pieter Johannes Wilhelmus Jochems; Adrianus Teunis Van Zanten, all of Eindhoven, Netherlands

[73] Assignee: U.S. Philips Corporation, New York, N.Y.

[21] Appl. No.: 754,896

[22] Filed: Dec. 27, 1976

[30] Foreign Application Priority Data

Oct. 25, 1976 [NL] Netherlands .......................... 7611773

[51] Int. Cl.² ............................................ H01L 21/26
[52] U.S. Cl. ........................................ 148/1.5; 148/187
[58] Field of Search ................................. 148/187, 1.5

[56] References Cited

U.S. PATENT DOCUMENTS

| 3,873,372 | 3/1975 | Johnson ............................ 148/1.5 |
| 4,013,489 | 3/1977 | Oldham ........................ 148/187 X |

*Primary Examiner*—G. Ozaki
*Attorney, Agent, or Firm*—Frank R. Trifari

[57] ABSTRACT

In Locos N-channel MOST-IC's underpasses can be obtained below the locos pattern by performing, at the area where the underpasses are to be formed, an As or Sb implantation prior to providing the locos. By using the nitride mask as an implantation mask, the locos and the source/drain zones of the transistors can be provided in a self-registering manner with respect to the underpasses.

6 Claims, 11 Drawing Figures

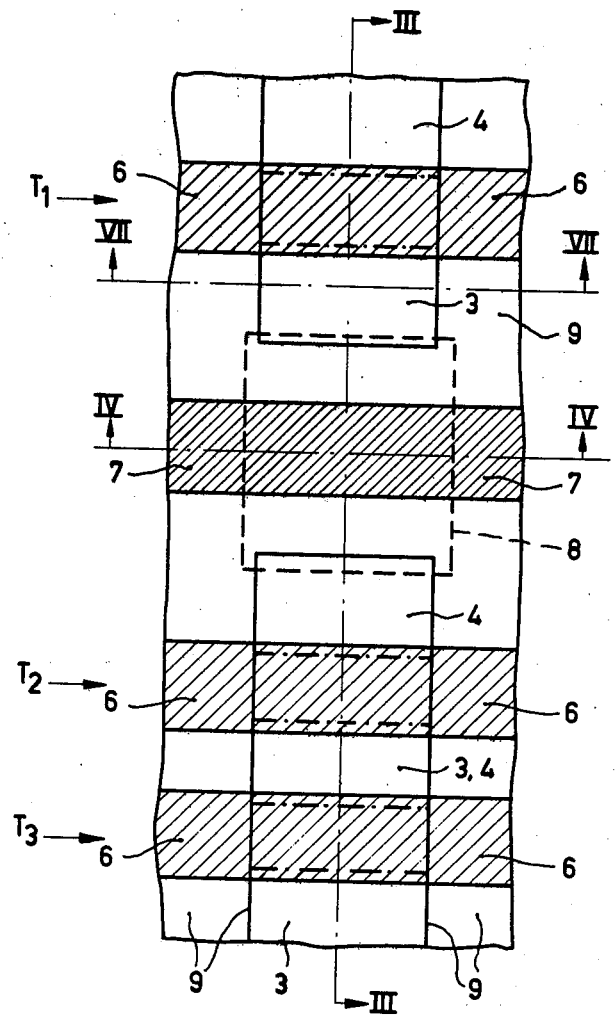
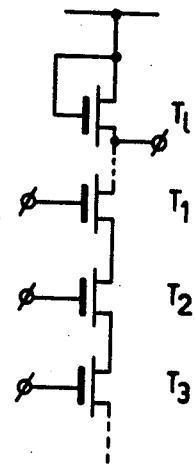
Fig. 1
Fig. 2
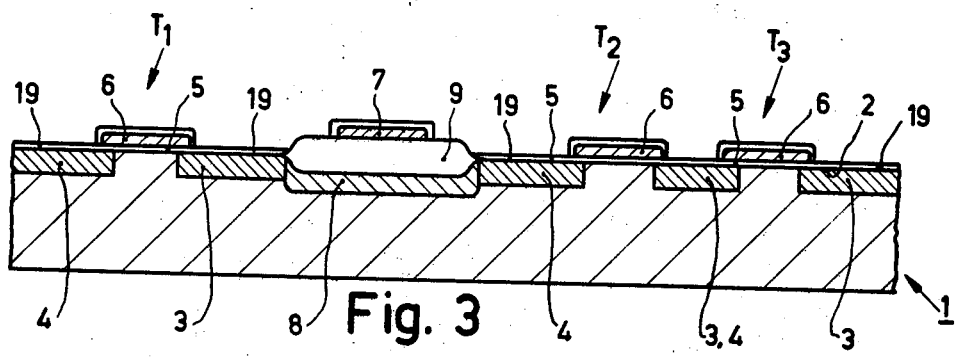
Fig. 3

METHOD OF MANUFACTURING A SEMICONDUCTOR DEVICE

The invention relates to a method of manufacturing a semiconductor device having a semiconductor body comprising a surface-adjoining region of mainly one conductivity type in which there are provided at least two insulated gate field effect transistors whose source and drain zones are formed by surface-adjoining zones of the second conductivity type, at least a further surface zone of the second conductivity type which forms a conductive connection between one of the source and drain zones of one field effect transistor and one of the source and drain zones of the other field effect transistor, such further surface zone being formed in the region of the one conductivity type.

The invention relates in addition to a semiconductor device manufactured by using such a method.

In integrated circuits, the pattern of conductors which connects the circuit elements together and to external supply conductors is usually formed by depositing a conductive layer of, for example, aluminum on an insulating layer on the surface of the semiconductor body and providing in said layer, by etching, a pattern of conductors which are contacted to the zones of the circuit elements via windows in the insulating layer. In addition it is known to connect circuit elements together by means of zones which are diffused or implanted in the semiconductor body. Such zones, sometimes termed underpasses, present inter alia the advantage that connections crossing each other can be provided in the circuit by means of only a single metallization layer.

In integrated circuits having insulated gate field effect transistors, such underpasses are usually provided simultaneously with the source and drain zones of the transistors. However, this is not always possible; in some cases the underpasses and the source and drain zones of the transistors can be manufactured only in separate diffusion or implantation steps. This may be the case, for example, when the field effect transistors are manufactured in a self-registering manner in which first the gate electrodes are provided and the source and drain zones are manufactured only in a subsequent operational step by means of a doping step in which the insulated gate electrodes exert a masking effect. Since consequently the doping step is carried out after providing the gate electrodes, it is not possible to manufacture connections which cross each other as described above with only a single metallization layer.

German Patent Application 23 15 761 discloses a method in which the underpasses and the source and drain zones are provided during separate diffusion treatments. This known process starts by providing the underpasses in the semiconductor body by means of masked diffusion of impurities. The diffusion mask is then removed and replaced by a comparatively thick silicon oxide layer which covers the diffused pattern of conductors. Apertures are made in said thick oxide layer to expose parts of the semiconductor body in which the source and drain zones of the transistors are diffused. The apertures or windows are usually provided in an oxide layer according to the so-called photolithographic etching process in which a layer of photolacquer is provided on the oxide layer and in which a certain pattern is formed by exposure to radiation via a photo-mask. The oxide layer is then subjected to an etching treatment to form the apertures. The remaining parts of the layer of photolacquer mask the underlying oxide during said etching treatment.

The apertures in the thick oxide layer should be provided so that, after diffusing the source and drain zones of the transistors, the pattern of conductors diffused in the semiconductor body adjoins the source and drain zones of the transistors, at least at the area where this is desired, so as to obtain a low-ohmic connection. The apertures in the thick oxide layer should therefore be positioned accurately with respect to the diffused pattern of conductors, which means that the photomask used for producing the apertures should be aligned accurately with respect to the diffused pattern of conductors already present in the body.

Preferably accurate aligning steps are generally avoided in semiconductor technology. Such steps are usually rather cumbersome. In addition, the possibility of defects in the ultimate semiconductor device as a result of faulty alignment increases considerably with the number of critical aligning steps during the whole process. Furthermore, such critical aligning steps may impose limits on the smallest dimensions of the device to be manufactured.

It is therefore an object of the invention to provide a diffused or implanted underpass in a monolithic integrated circuit comprising two or more insulated gate field effect transistors, without this involving extra critical alignment operations.

According to the invention this object is achieved by a unique combination of a number of operational steps in which there is started from the recognition that the etching of apertures in a thick oxide layer can be avoided by providing the thick oxide only locally by means of local oxidation of the semiconductor body such being done by means of an oxidation mask which can also be used, at least partly, as a doping mask for producing the underpasses in the semiconductor body.

In the method of the kind described in the preamble the starting material is a semiconductor body of which at least the surface-adjoining region is of p-type silicon and a doping mask, which contains an aperture at the area of the surface zone to be provided, is positioned on the surface and comprises, at least at the area of the field effect transistors to be provided, layer portions of a material masking the body against oxidation. Atoms selected from the group As and Sb are provided in the semiconductor body via the aperture in the doping mask, after which the doping mask is removed partly so as to obtain an oxidation mask comprising the layer portions. The body is then subjected to an oxidation treatment so as to obtain an oxide pattern which is at least partly sunk in the semiconductor body and which extends beside the layer portions masking against oxidation and above the surface zone. During the oxidation treatment the As or Sb atoms provided in the body at the area of the surface zone diffuse deeper into the semiconductor body and form there the n-type surface zone below and adjoining the sunken oxide, after which the insulated gate electrodes are provided at the area of the field effect transistors to be formed, which electrodes, viewed on the surface, are situated on either side of and at a distance from the surface zone, and the source and drain zones of the field effect transistors adjoining the sunken oxide pattern are provided by means of doping with an impurity selected from the group P, As and Sb in a self-registering manner down to a depth at which the zones of the field effect transistors to be connected together adjoin the surface below the sunken oxide pattern.

It has surprisingly been found in experiments which have led to the invention that the As or Sb impurities provided in the semiconductor body prior to the oxidation treatment, can form (after the oxidation treatment in which just the part of the silicon body where in general the doping concentration is highest is converted into insulating oxide) an n-type - doped zone below the sunken oxide, which zone is sufficiently low-ohmic to be used as an underpass. These experiments have proved in addition that by providing the source and/or drain zones of the transistors with the sunken oxide above the underpass as an implantation or diffusion mask, a good connection between said zones and the underpass(es) can automatically be obtained if only said zones are diffused down to a sufficiently large depth into the body, as will become apparent from the description of the Figures.

Preferably a sunken oxide pattern having a thickness of at least 1 μm is formed.

Simultaneously with the provision of the insulated electrodes, conductor tracks which cross the diffused or implanted underpasses below the pattern can be provided above the sunken oxide pattern.

A layer of silicon nitride or a double layer of silicon nitride and silicon oxide may be used for the masking layer masking the body against oxidation. After the oxidation treatment, parts of said oxidation mask may be used, if desired, as a gate dielectric or gate insulator, the gate electrodes of the transistors to be manufactured being formed on the masking layer, after which the silicon nitride is removed at the area where the source and drain zones are to be provided by means of a selective etching treatment in which the sunken oxide pattern is not attacked at all.

Usually, however, it is recommendable, in connection with the requirements to be imposed upon the gate dielectric, to replace the masking layer forming the oxidation mask prior to providing the insulated gate electrodes by a fresh insulating layer on which the gate electrodes are formed and which may then be provided with windows for the diffusion and/or implantation of the source and drain zones of the transistors.

It has been found that very favourable results can be obtained by using arsenic as an impurity which is provided in the semiconductor body via the said aperture in the doping mask for forming of the underpass.

The layer portions masking against oxidation can be obtained by first providing over the whole surface a layer of, for example, silicon nitride and etching herein a window corresponding to the aperture in the doping mask and, after the doping step, restricting said silicon nitride layer, likewise by etching, to the said layer portions forming the oxidation mask. In a preferred embodiment of the invention, the oxidation mask is provided prior to providing the As or Sb impurity in the semiconductor body via the doping mask, after which a layer masking the semiconductor body against doping (hereinafter termed "second masking layer") is formed on the surface of the semiconductor body, said masking layer consisting of a material which can be removed selectively with respect to the oxidation mask and which is provided with a pattern which, together with the oxidation mask, forms the said doping mask. So in this method the silicon nitride layer is subjected only to a single photoetching step, which means a considerable simplification of the manufacturing process.

A simple preferred embodiment is characterized in that the second masking layer consists of a layer of photolacquer and that the n-type impurity is provided in the semiconductor body by means of ion implantation via the first aperture.

The invention will now be described in greater detail with reference to an embodiment and the accompanying diagrammatic drawings in which FIG. 1 is a plan view of a part of a semiconductor device manufactured by using a method according to the invention, FIG. 2 shows the electric circuit diagram of a circuit arrangement which can comprise the structure shown in FIG. 1 in an integrated form.

Figure 5:
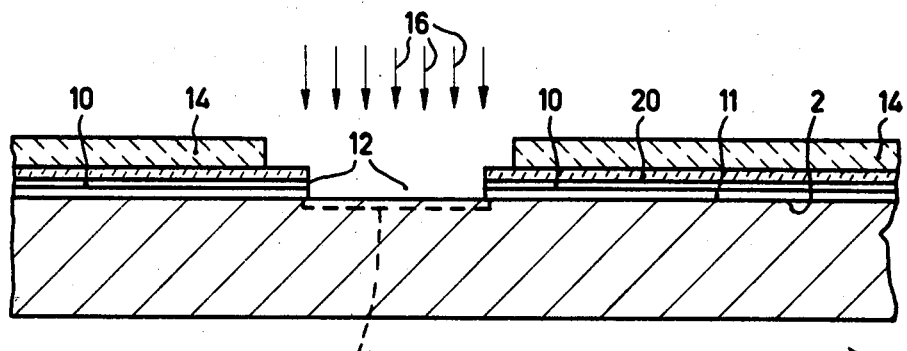
Figure 6:
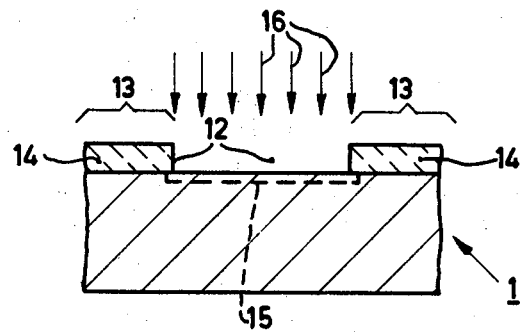
Figure 7:
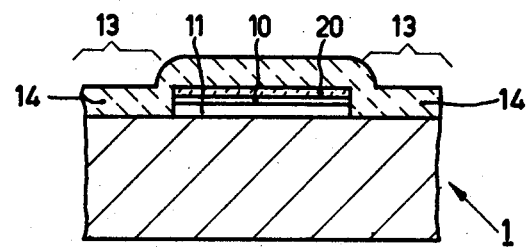
Figure 8:
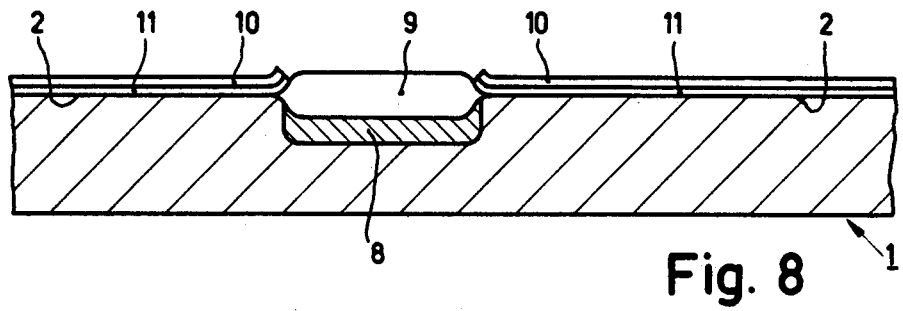
Figure 9:
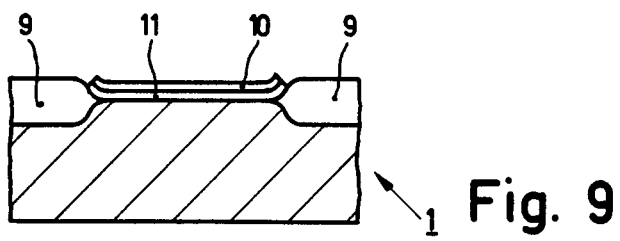

FIG. 3 is a sectional view of the device shown in FIG. 1 taken on the line III—III of FIG. 1, and FIG. 4 is a sectional view of said device taken on the line IV—IV of FIG. 1, FIGS. 5, 8, 10 and 11 are sectional views taken on the line III—III of FIG. 1 during a few stages of the manufacture of the device, FIG. 6 is a sectional view of the device taken on the line IV—IV during the manufacture of the device, and FIGS. 7 and 9 are sectional views taken on the line VII—VII of FIG. 1 during a few stages of the manufacture of the device.

It is to be noted that the Figures are diagrammatic only and are not drawn to scale.

FIGS. 1, 3 and 4 show a part of a semiconductor device in the form of an integrated circuit having a number of insulated gate field effect transistors. The transistors are mutually connected in series and are referenced $T_1$, $T_2$ and $T_3$. FIG. 2 shows a specific electrical circuit diagram with such series-arranged transistors. The transistors $T_1$, $T_2$ and $T_3$ each form an input of a so-called logical "and-not" gate or "nand" gate, of which the output signal can be derived from the load transistor $T_1$. Gates of the kind shown in FIG. 2 may be combined in large numbers in a common body to form "cross-bar"-like systems for, for example, memories.

The device comprises a monolithic semiconductor body which is mainly of a given conductivity type. Of course, alternatively, a non-homogeneously doped body may be used in which comprises a partial layer of one conductivity type adjoining the surface 2 and provided, for example, epitaxially, and a region or substrate of the second conductivity type opposite to the first conductivity type adjoining said partial layer.

The transistors $T_1$-$T_3$ each comprise a source zone 3 and a drain zone 4 in the form of zones of the opposite conductivity type adjoining the surface 2. It is to be noted that as a result of the specific circuit the drain zone 4 of, for example, transistor $T_3$ also forms the source zone 3 of transistor $T_2$ and that consequently the source zone 3 of $T_2$ and the drain zone 4 of $T_3$ are constructed as a common zone. In the plan view shown in FIG. 1 the boundaries of the source and drain zones 3, 4 are denoted by dot-and-dash lines.

The insulated gate electrodes 6 of the transistors $T_1$-$T_3$ are provided above the channel regions between the source and drain zones and separated by the intermediate dielectric layer 5. The device furthermore comprises a pattern of conductors so as to connect the various circuit elements together and to external supply conductors. In addition to, for example, a usual strip-shaped conductor 7 provided above the surface 2, said pattern of conductors comprises the surface zone 8 provided in the body 1 and being of the same conductivity type as the source and drain zones 3, 4 and opposite to the conductivity type of the body 1. The zone 8, sometimes termed underpass, which forms a connection between the drain zone 4 of $T_2$ and the source zone 3 of transistor $T_1$, is insulated from the conductor 7 by an intermediately located comparatively thick insulating layer 9. The underpass 8 is shown in FIG. 1 by broken lines. The device shown as a sectional view in FIG. 3 may be subjected in known manner to further treatments which are obvious to those skilled in the art. For example, contact holes may be etched in the oxide layer 19, after which a second conductor track of, for example, Al is provided on the device and is contacted to the circuit elements via said contact holes.

Underpasses of the kind described and shown present very important advantages. First of all they considerably increase the interconnection possibilities and thus simplify generally the design of the integrated circuit, in particular in the case in which the number of circuit elements is very large (L.S.I.). In addition, by using underpasses, the number of contact holes which are to be provided in the passivating layer 5 on the surface 2 for contacting zones 3, 4 by means of the usual conductor tracks provided on the passivating layer, can be restricted. A further important advantage is that the number of such conductor tracks can be reduced and hence there can be reduced, also, the possibility of short-circuits between said conductor tracks and the underlying semiconductor material via pin holes in the insulating passivating layer.

The structure described can be manufactured in a comparatively simple manner and substantially entirely in a self-registering manner by using a method which will be explained in greater detail with reference to FIGS. 5 – 9.

Starting material is a semiconductor body 1 of which at least a partial layer or partial region adjoining the surface 2 is of p-type silicon and which semiconductor body in the present embodiment is entirely of the p-conductivity type. The resistivity of the body is between 1 and 40 ohm. cm. If desired, the doping in a thin partial layer of the body adjoining the surface 2 can be increased and hence the resistivity be reduced — for example by means of ion implantation of a p-type impurity, so as to prevent at least locally the formation of n-type inversion channels adjoining the surface 2. The thickness of the semiconductive body 1 is approximately 250 $\mu$m; the lateral dimensions are assumed to be sufficiently large to be able to comprise the circuit to be manufactured.

In the first treatment consisting of a doping step to which the semiconductor body 1 (FIG. 5) is subjected, the body is first provided with a doping mask. First of all, a layer 10 is provided on the surface 2 which can mask the underlying silicon against oxidation. Although other materials may also be used, silicon nitride is used in the present embodiment. If desired, the nitride layer 10 may be provided directly on the surface 2, but in most of the cases it is recommendable, to prevent the possible occurrence of mechanical stresses in the nitride layer, to provide a thin oxide layer 11 between the nitride layer and the semiconductor material. The nitride layer can be obtained in known manner, for example, by heating in a mixture of $NH_3$ and $SiH_4$. The thickness of the nitride layer 10 is, for example, between 1500 and 2000 Å. The thickness of the underlying silicon oxide layer 11, which can be formed at the surface 2 by thermal oxidation of the body 1, is approximately 500 Å.

By means of an etching treatment, the silicon nitride layer is restricted to layer portions situated above those parts of the semiconductor body in which, in a later stage of the manufacture, circuit elements are to be provided, for example field effect transistors or diodes and/or resistors. Said layer portions which are referenced 10 in FIG. 5, do not cover at least the part of the surface of the semiconductor body where the underpass is to be provided.

In the case in which the silicon nitride 10 (with the underlying silicon oxide 11) is removed only at the area of the underpasses to be provided, the first doping step may then be carried out directly, the nitride 10 with the underlying oxide 11 forming the doping mask. The silicon nitride layer 10 may then again be subjected to a fresh etching treatment so as to obtain the oxidation mask. In the present embodiment, however, the layer portions 10 of the silicon nitride layer are directly provided in the pattern of the oxidation mask which not only does not cover the surface 2 of the body 1 at the area of the underpass or underpasses to be provided, but also does not cover other places where thick field oxide will be provided.

In order to obtain the oxidation mask with the layer portions 10, an etching mask consisting of a layer of photolacquer 20 (FIG. 5) may be provided on the silicon nitride layer, after which the silicon nitride is subjected to a material-removing treatment. The nitride may be removed in known manner, for example, by etching in a phosphoric acid solution at a temperature of approximately 150° C or by so-called plasma etching. By means of the same mask, the silicon oxide layer 11 may then also be removed locally.

Because, besides at the area of the underpass(es) to be provided, the surface 2 of the body 1 is now exposed also in places where the body during the next following doping step should not be doped, a second masking layer 14 of a material which can mask the body against doping with impurities and which can be etched selectively with respect to silicon nitride, is provided on the surface 2. Since the doping step is carried out by means of ion implantation, a layer of photolacquer may simply be used for the second masking layer 14 (FIGS. 5 to 7).

The layer of photolacquer 14 which may further extend substantially over the whole surface of the semiconductor body shows apertures mainly only at the area of the underpasses to be provided. As shown in FIG. 5, the provision of the mask 14 requires no critical and accurate aligning step with respect to the pattern in the silicon nitride layer 10.

In this manner a doping mask is obtained which shows an aperture or window 12 at the area of the underpass(es) 8, of which aperture or window, as shown in FIG. 5, two edges are defined by the layers 10, 11 and, as shown in FIG. 6, the two other edges are defined by the layer of photolacquer 14.

In the next step, an n-type impurity selected from the group As and Sb is introduced, via the window 12, into the surface region 15 of the semiconductor body 1 shown in broken lines in the drawing. The impurity is provided by means of ion implantation denoted diagrammatically by the arrows 16. As is known, the energy with which the ions are implanted in the semiconductor body 1 may be chosen to be so that the layer of photolacquer 14 is impervious to the ions and can thus fulfill a masking function. It is to be noted that in the case in which other known doping methods are used, for example diffusion, which generally are carried out at higher temperatures, the layer of photolacquer 14 should generally be replaced by a material which can withstand high temperatures, for example silicon oxide. Such an oxide mask can be obtained by first depositing from the vapour phase a silicon oxide layer over the whole surface of the body 1 and then patterning said layer by means of known photo-etching processes.

In the present embodiment arsenic is used as an impurity due to its favorable diffusion coefficient in silicon. The doping concentration is approximately $10^{15}$ atoms per sq. cm.

After the arsenic doping the mask 14, as well as the layer of photolacquer 20, are removed entirely so that the semiconductor body 1 is exposed not only at the area of the aperture or window 12, but also at the area of adjoining further surface parts 13 which are not covered by the silicon nitride layer portions 10. Via these further surface portions the semiconductor body 1 is locally subjected to an oxidation treatment so as to obtain the oxide pattern 9 which is sunk in the body at least over a part of its thickness. This step is shown in FIGS. 8 and 9, FIG. 8 again being a sectional view through the device taken on the line III — III of FIG. 1 and FIG. 9 being a sectional view taken on the same line VII — VII of FIG. 1 as the sectional view shown in FIG. 7.

The oxidation is carried out at a temperature of approximately 1000° C in an oxidizing medium for approximately 16 hours. The thickness of the oxide is then approximately 1.8 $\mu$m. Simultaneously, the arsenic atoms provided in the surface region 15 (FIGS. 5 and 6) diffuse deeper in the semiconductor body 1 and form there the n+ doped zone 8 below the sunken oxide pattern. The resistance per square of the zone 8 upon measurement proves to be surprisingly approximately only 100 ohms and thus is sufficiently low to be able to use the zone 8 as an underpass. A possible explanation why zones having such a low resistance (hence high doping) can be obtained with n-type impurities from the group As and Sb may be that the impurity atoms which are provided in the surface region 15 prior to the oxidation do not land in the growing oxide during the oxidation but are stowed for the greater part ahead of the oxide deeper in the semiconductor body; As a result of this the zone 8 may comprise the greater part of the originally implanted arsenic atoms and thus show a comparatively high doping concentration and hence a comparatively low resistivity.

The thickness of the surface zone 8 is approximately 2 $\mu$m from the original surface 2, which proves to be a very favourable value in connection with the lateral diffusion (parallel to the surface) which is of a magnitude comparable to the vertical diffusion (normal to the surface) of As. Arsenic is to be preferred over Sb inter alia for this reason. The diffusion constant of P which also forms an n-type impurity in Si is so large that when using P at the given duration of the oxidation treatment, the phosphorus atoms diffuse very far into the semiconductor body so that the zone 18 as a result of the lateral diffusion would extend far beside the sunken oxide pattern up to the surface 2. The diffusion constant of Sb on the contrary is considerably smaller than that of As so that, when Sb is used instead of As, difficulties may arise upon forming good connections between the underpass and the zones of the transistors to be formed in a subsequent process step.

The sunken oxide pattern 9 which is shown in solid lines in FIG. 1 comprises, viewed in the plan view of FIG. 1, apertures in which the field effect transistors $T_1$-$T_3$ can now be formed.

Figure 10:
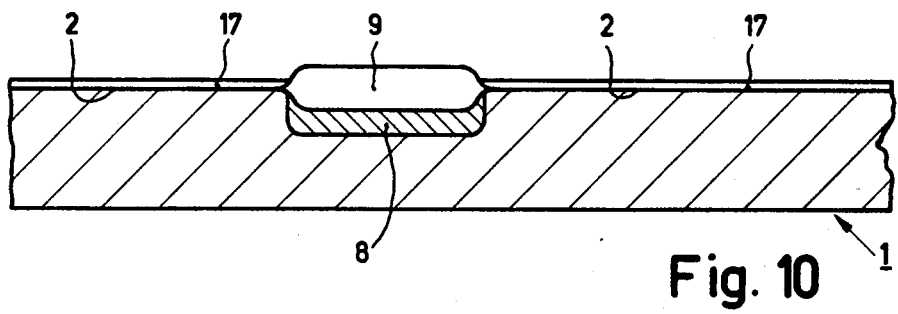

After the oxidation treatment, the gate electrodes of the field effect transistors to be manufactured could be provided directly on the silicon nitride layer 10, in which the nitride layer 10 with the underlying oxide layer 11 would form the gate dielectric of the transistors. In most of the cases, however, it is to be preferred to remove the nitride layer 10 with the oxide layer 11 entirely and to replace it by a fresh insulating layer 17 which in the present embodiment consists only of a silicon oxide layer in a thickness of 700 Å but which may alternatively consist of other materials, for example silicon nitride or aluminium oxide or of a combination of different layers. FIG. 10 shows the device in this stage of the process.

Figure 11:
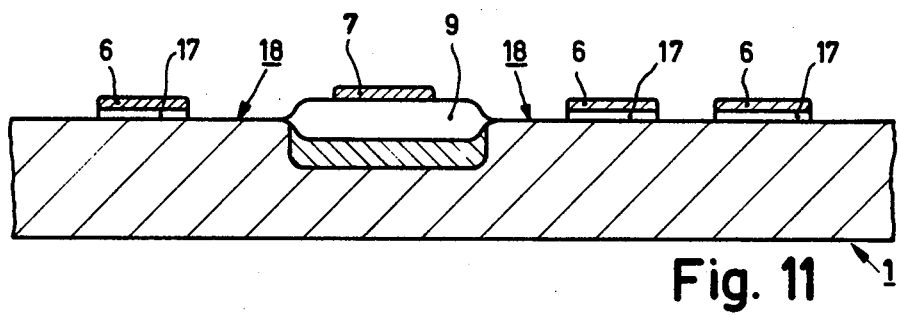

The strips 6 which are to form the insulated gate electrodes of the transistors are then provided on the oxide layer 17. Simultaneously with the gate electrodes 6 a conductor 7 is provided which crosses the underpass 8. The strips 6 and 7 are manufactured from polycrystalline silicon and may be provided in a manner known per se. As shown in FIG. 11, gate electrodes 6 are provided on either side of the underpass 8 in such manner that some space remains between said gate electrodes and the sunken oxide above the underpass 8. The oxide layer 17 is subjected to an etching treatment and is removed in so far as it is not covered by the polycrystalline silicon layers 6, 7. During said etching treatment it is not necessary to mask the sunken oxide pattern 9, because the etching treatment can take place in a very short time as a result of the small thickness of the oxide layer 17 without noteworthily attacking the very thick oxide pattern 9. FIG. 11 shows the device in this stage of the process. In a self-registering manner, the n-type zones 3 and 4 of the transistors $T_1$ and $T_2$ can be provided via the surface parts 18 defined by the gate electrodes 6 and the sunken oxide pattern 9, which zones should be connected together by the n-type zone 8 forming the underpass. The zones 3, 4 can be provided by diffusing, via the surface parts 18, an n-type impurity, for example phosphorus atoms, into the body. In this doping step, P is to be preferred over As or Sb due to the higher diffusion rate of P. It has been found that, when the P atoms are diffused down to a depth of approximately 1.5 $\mu$m from the surface into the body, a good low-ohmic connection can be produced between said zones and the arsenic-doped underpass 8. Simultaneously with the zones 3 and 4 of the transistors $T_1$ and $T_2$, respectively, the remaining zones of said transistors and zones of other circuit elements, for example the zones 3 of transistor $T_3$, can also be provided. In addition, during said doping step the polycrystalline strips 6 and 7 may be doped with P so as to reduce the resistance. In the case in which the diffusion takes place in an oxidizing medium an oxide layer 19 may grow in addition above the source and drain zones of the transistors to be provided, while also the polycrystalline strips 6 and 7 may be partly oxidized. The device shown as a sectional view in FIG. 3 may be subjected in known manner to further treatments which are obvious to those skilled in the art. For example, contact holes may be etched in the oxide layer 19, after which a second conductor track of, for example, Al is provided on the device and is contacted to the circuit elements via said contact holes.

It is to be noted that the process described is very simple as compared with known processes of manufacturing integrated circuits having field effect transistors. By using the method according to the invention, an underpass 8 can be obtained in such an integrated circuit in a substantially self-registering manner.

It will be obvious that the invention is not restricted to the embodiment but that many variations are possible to those skilled in the art without departing from the scope of this invention.

For example, instead of by diffusion the source and drain zones 3, 4 of the transistors may alternatively be provided by means of ion implantation in which, if desired, the ions may be implanted through the oxide layers 17 with sufficiently high energy so that it will not be necessary in that case to remove the oxide layer 17 at the area of the surface parts 18 (see FIG. 11).

The polycrystalline silicon layers 6, 7 may be doped simultaneously with the deposition of the polycrystalline material instead of simultaneously with the source and drain zones 3, 4 of the transistors.

What is claimed is:

1. A method of manufacturing a semiconductor device having a semiconductor body comprising a surface and a surface-adjoining region of p-type silicon in which there are present at least two insulated gate field effect transistors whose source and drain zones are formed by n-type conductivity surface-adjoining zones, said body comprising at least a n-type conductivity further surface zone which forms a conductive connection between one of the source and drain zones of one field effect transistor and one of the source and drain zones of the other field effect transistor, said further surface zone being formed in said p-type surface region, said method comprising the steps of:
   (a) positioning on said surface a doping mask which has an aperture at a predetermined area of said surface at which the surface zone is to be provided, said surface comprising a certain other area at which said the field effect transistors are to be provided, said doping mask comprising at at least said certain other area layer portions of a material masking said body against oxidation,
   (b) providing atoms selected from the group As and Sb, in the semiconductor body via said aperture in the doping mask,
   (c) after such provision of said atoms, removing partly said doping mask so as to obtain an oxidation mask which comprises said layer portions,
   (d) then subjecting said body to an oxidation treatment so as to obtain an oxide pattern which is at least partly sunk in the semiconductor body and which extends beside the layer portions masking against oxidation and above said predetermined area intended for the surface zone, during such oxidation treatment said atoms provided in the body at said predetermined area for the surface zone being caused to diffuse deeper into said semiconductor body and form there said n-type surface zone located below and adjoining the sunken oxide,
   (e) after such oxidation treatment, providing insulated gate electrodes of said transistors at said predetermined area, where said field effect transistors are to be formed, which electrodes, viewed on the surface, are situated on either side of and at a distance from said surface zone, and
   (f) providing the source and drain zones of the field effect transistors adjoining the sunken oxide pattern by doping exposed parts of said region with an impurity selected from the group P, As and Sb in a self-registering manner down to a depth at which the said zones of the field effect transistors that are to be connected together adjoin said surface zone below said sunken oxide pattern.

2. A method as in claim 1, wherein said sunken oxide pattern has a thickness of at least 1 micron.

3. A method as in claim 1, wherein said impurity which is provided in the semiconductor body via said aperture in the doping mask so as to obtain the n-type surface zone consists essentially of arsenic.

4. A method as in claim 1, wherein said impurity for forming said source and drain zones of the field effect transistors consists essentially of phosphorus.

5. A method as in claim 1, wherein said oxidation mask is provided before the As or Sb impurity is introduced into the semiconductor body via the doping mask, after which a second masking layer masking said semiconductor body against doping, is formed at the surface of said semiconductor body and consists of a material which can be removed selectively with respect to said oxidation mask, which second masking layer is provided with a pattern which, together with the oxidation mask, forms said doping mask.

6. A method as in claim 5, wherein said second masking layer consists of a layer of photolacquer and the n-type impurity is introduced into the semiconductor body by means of ion implantation via the first aperture.

* * * * *

UNITED STATES PATENT AND TRADEMARK OFFICE
CERTIFICATE OF CORRECTION

PATENT NO. : 4,101,344
DATED : July 18, 1978
INVENTOR(S) : ELSE KOOI ET AL

It is certified that error appears in the above-identified patent and that said Letters Patent are hereby corrected as shown below:

Column 9, line 38, after "the", --further-- should be inserted;
Column 10, line 6, after "the", --further-- should be inserted;
           line 8, after "the", --further-- should be inserted;
           line 10, before "surface", --further-- should be inserted;
           lines 13 and 14, "predetermined area," should read --certain other area--;
           line 17, after "said", --further-- should be inserted;
           line 24, after "said", --further-- should be inserted;
           line 48, "first" should read --said--.

Signed and Sealed this

Tenth Day of June 1980

[SEAL]

Attest:

SIDNEY A. DIAMOND

Attesting Officer     Commissioner of Patents and Trademarks